United States Patent [19]

Bailey et al.

[11] Patent Number: 5,325,322
[45] Date of Patent: Jun. 28, 1994

[54] HIGH-SPEED PROGRAMMABLE ANALOG TRANSVERSAL FILTER HAVING A LARGE DYNAMIC RANGE

[75] Inventors: James A. Bailey; James E. Malmberg, both of Tucson, Ariz.

[73] Assignee: International Business Machines Corporation, Armonk, N.Y.

[21] Appl. No.: 77,161

[22] Filed: Jun. 14, 1993

[51] Int. Cl.$^5$ .......................... G06G 7/02; G06G 7/00
[52] U.S. Cl. ..................................... 364/825; 364/861
[58] Field of Search ....................... 364/825, 861, 862; 333/173

[56] References Cited

U.S. PATENT DOCUMENTS

| | | | |
|---|---|---|---|
| 3,783,413 | 1/1974 | Froment et al. | 332/23 |
| 4,244,030 | 1/1981 | Albarello | 364/825 |
| 4,316,258 | 2/1982 | Berger | 364/602 |
| 4,470,126 | 9/1984 | Haque | 364/825 |
| 4,524,425 | 6/1985 | Bertails | 364/825 |
| 4,543,534 | 9/1985 | Temes et al. | 330/9 |
| 4,628,474 | 12/1986 | Serfaty et al. | 364/825 |
| 4,646,258 | 2/1987 | Miodownik | 364/825 |
| 4,661,948 | 4/1987 | Shapiro et al. | 370/77 |
| 4,849,662 | 7/1989 | Holberg et al. | 307/520 |
| 5,168,461 | 12/1992 | Wu et al. | 364/825 X |

OTHER PUBLICATIONS

"Finite-Impulse-Response Filters", *Electronics Engineer's Handbook*, McGraw-Hill Book Company, New York, NY, Chapter 8, pp. 78-81.

"A Switched-Capacitor Realization of Multiple FIR Filters on a Single Chip", Lee et al., *IEEE Journal of Solids-State Circuits*, vol. 23, No. 2, pp. 536-542, Apr. 1988.

*Primary Examiner*—Tan V. Mai
*Attorney, Agent, or Firm*—Baker, Maxham, Jester & Meador

[57] ABSTRACT

A programmable analog transversal filter suitable for monolithic Bipolar-Complimentary-Metal-Oxide Semiconductor (BiCMOS) realization. The tap weights are digitally programmable by capacitor-switching responsive to binary input signals. Speed is improved by combining the multiplication and summation functions into a single capacitor array without operational amplifiers. A continuous analog input signal is filtered to produce a discrete time analog output signal, which may be made continuous by adding a low-pass filter. The capacitor array performs both multiplication and summation functions simultaneously and automatically normalizes the resulting output signal. Because no operational amplifiers are used in the multiplication/summation functions, they are not limited by operational amplifier dynamic range and slew-rate.

13 Claims, 6 Drawing Sheets

S = SIGNED BINARY CONTROL WORD
$C_v$ = S·C MICROFARADS

HIGH-SPEED PROGRAMMABLE ANALOG TRANSVERSAL FILTER HAVING A LARGE DYNAMIC RANGE

BACKGROUND OF THE INVENTION

1. Field of the Invention

This invention relates to monolithic analog filter circuits and, more specifically, to a programmable switched-capacitor transversal finite-impulse-response (FIR) filter implemented without active summation to avoid operational amplifier slew-rate limitations on filter bandwidth.

2. Discussion of the Related Art

The direct form of a Finite-Impulse-Response (FIR) nonrecursive filter is the tapped-delay-line filter or transversal filter in which the continuous input signal is sampled at a sampling rate $f_s = 1/T$. The sampling section is followed by M delay stages (FIG. 1), each of which delays the associated sample by the sampling period T. At each node, the delayed signal sample is multiplied by a weighting coefficient and the products are summed to produce a discrete time filter output signal. FIR filters in symmetrical form provide truly linear phase response at frequencies up to the Nyquist frequency of $f_s/2$, an advantage not available in other filter forms. Moreover, such filters provide very narrow transition bands on the order of 150dB per octave.

High-speed implementation of the analog transversal filter is readily accomplished using a charge-transfer device such as a charge-coupled device (CCD) or a bucket brigade device (BBD). Fully digital implementations are also well-known in the art. Although the fully digital implementations can be programmed by employing digital weighting functions, the faster CCD and BBD transversal filters are not programmable because the established tap weight multipliers may not be altered by program control to provide a different transversal filter characteristic. Because a programmable analog transversal filter is very useful, many practitioners have proposed strategies for providing variable tap weight multipliers in an analog transversal filter.

The fastest FIR filters are perhaps those realized on monolithic integrated circuits (ICs) implemented using CCD or BBD technology. For instance, in U.S. Pat. No. 4,316,258, Jean L. Berger discloses a digitally-programmable filter using electrical charge transfer. Berger relies on a digital-analog multiplication and summation scheme whereby digital tap weights are multiplied with analog charge values in a tapped delay line configuration. However, Berger's device has limited dynamic range.

The most versatile and widest dynamic range FIR filters have been realized using fully digital signal processing techniques. These often require external analog-to-digital (A/D) converters and sometimes have limited sampling rates. For general background, reference is made to Y. Tsividis et al, *Design of MOS VLSI Circuits for Telecommunications*, Prentice Hall, Englewood Cliffs, N.J., 1985. The digital transversal filter is too slow for many applications.

A third alternative is to realize FIR filters using analog switched-capacitor (SC) techniques. This approach may have speed superior to the digital signal processing techniques and can exhibit a dynamic range superior to the CCD approach. No A/D converters are necessary and the processing is less specialized than required for CCD or BBD filters. The existing programmable SC FIR filter incorporates digital-analog multiplying techniques to permit the control of tap weights by digital means. Y. Lee, et al ("A Switched-Capacitor Realization of Multiple FIR Filters On A Single Chip", *IEEE Journal of Solids-State Circuits*, Vol. 23, No. 2, pp. 536–542, April 1988) observes that even higher signal processing speed is available in exchange for eliminating such digital programming features in SC FIR filters.

Switched-capacitor programming techniques are well-known in the art. For instance, in U.S. Pat. No. 4,244,030, Alain Albarello teaches a switched-capacitor multiplexing filter. As is universally taught in the art, Albarello uses an operational amplifier as a tap signal summing device at his SC filter output.

In U.S. Pat. No. 4,543,534, Gabor C. Temes, et al teach a switched-capacitor technique for overcoming operational amplifier offset effects in a Multiplying Digital-to-Analog Converter (MDAC). Temes, et al switch capacitive compensation during the non-sampling period to avoid output discontinuities and to compensate for the offset voltage of the summing amplifier. These steps are necessary because all useful transversal tap signal summing techniques known in the art require an operational amplifier.

In U.S. Pat. No. 4,646,258, Saul Miodownik teaches a FIR notch filter that uses a switching arrangement to overcome the effects of component variations on narrow filter notches. Miodownik does not consider monolithic realization of his notch filter nor does he employ simultaneous signal summation but he does use an operational amplifier to sequentially sum his tap signals.

In the above-cited reference, Lee, et al describe a 32-input summing amplifier (FIG. 8A) based on the SC gain amplifier described in above-cited U.S. Pat. No. 4,453,534. Lee, et al give considerable attention to their summing amplifier despite its difficulty because all useful tap signal summing methods known in the art require an operational amplifier.

In U.S. Pat. No. 4,849,662, Douglas R. Holberg, et al disclose a method for time-sharing a digitally-programmable capacitive element suitable for use in a SC filter circuit. Holberg, et al primarily consider a method for conserving chip real estate by reducing the area necessary for filter capacitors but they, too, use an operational amplifier in the tap signal summing portion of their programmable filter despite the difficulty related to the use of such an active device.

In U.S. Pat. No. 4,470,126, Yusaf A. Haque discloses a programmable transversal filter (FIG. 2) that employs an analog cross-point switch to sequentially connect analog signal samples to a bank of multipliers, the outputs of which are summed through an operational amplifier. Haque's multipliers include a switched-capacitor bank in which the capacitance can be selected by means of a binary input signal (FIG. 4). The effective tap weight introduced by Haque's programmable multiplier is equal to a digitally-selected variable capacitance divided by a fixed operational amplifier feedback capacitance. Haque neither teaches nor considers a self-normalizing switched-capacitor multiplying and adding scheme that can be implemented without operational amplifiers.

The monolithic transversal filter realizations known in the art are limited in dynamic range and speed (sampling frequency). Digital realizations can eliminate the most troublesome dynamic range problems but are limited to relatively low operating frequencies. High-speed analog monolithic transversal filter realizations may offer better operating frequencies but are often seriously limited in dynamic range. The monolithic SC transversal filter offers the best compromise in dynamic range and operating frequency but improvement is hampered by the slew-rate limitations of the operational amplifiers used in the multiplier and summation elements of the filter.

Accordingly, a technique without operational amplifiers for multiplication and summation in a SC transversal filter represents an extraordinarily useful improvement to the filters known in the art. However, because of the universal presumption that tap signal summation and multiplication require operational amplifiers, no such techniques have before been suggested or proposed by practitioners in the art. The related limiting effects are clearly felt in the art and are solved by this invention in the manner described below.

SUMMARY OF THE INVENTION

The transversal filter of this invention uses switched capacitor (SC) arrays to accomplish both multiplication and summation functions. The multiplier and summer functions are integrated into a single circuit in this invention. This combined realization provides self-normalizing programmability of tap weight multiplier coefficients and is suitable for realization in either CMOS or BiCMOS technology.

It is an object of this invention to improve the dynamic range of the CS transversal filter. It is also an object of this invention to implement a monolithic analog transversal filter using programmable switched-capacitor tap weights without employing operational amplifiers in either the multiplication or summation circuits. It is an advantage of this invention that the absence of operational amplifiers in the summation and multiplication circuits eliminates operational amplifier slew-rate limitations on dynamic range.

It is another object of this invention to improve programming accuracy by eliminating the extra normalizing elements required for SC transverse filters in the prior art. It is an advantage of this invention that the tap signal charge is distributed among all SC capacitor arrays and the output voltage is self-normalizing because of the absence of opamp integrating capacitor elements.

Finally, it is an object of this invention to increase the maximum sampling frequency at which the SC transverse filter may operate and thereby exploit the improved speed. It is an advantage of this invention that the sample-and-hold (S/H) elements may be implemented in bipolar form and combined with the remaining elements in CMOS form, thereby improving the operating frequency range of the resulting filter.

This invention offers all of the advantages known for analog transversal filters compared to digital FIR filters, which include minimal IC real estate and elimination of quantization noise. Other advantages include much higher dynamic range and bandwidth than available in CCD analog implementations, high levels of monolithic integration with other analog and digital functions and full programmability.

The foregoing, together with other objects, features and advantages of this invention, will become more apparent when referring to the following specification, claims and the accompanying drawing.

BRIEF DESCRIPTION OF THE DRAWING

For a more complete understanding of this invention, reference is now made to the following detailed description of the embodiments as illustrated in the accompanying drawing, wherein:

FIG. 7, comprising FIG. 8, comprising

DETAILED DESCRIPTION OF THE PREFERRED EMBODIMENTS

The Analog Transversal Filter

Figure 1:
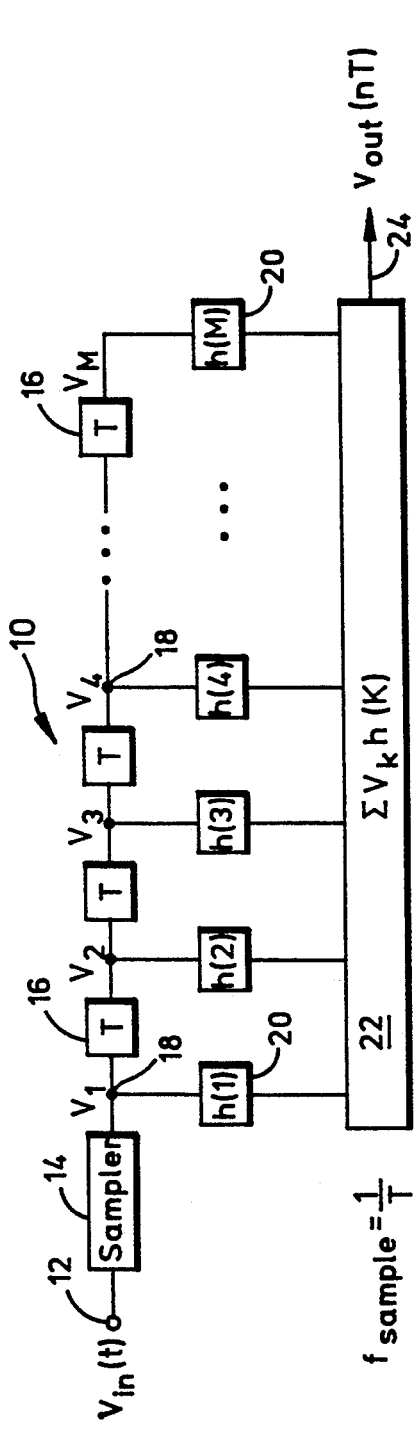
FIG. 1 shows a schematic representation of the FIR nonrecursive filter from the prior art.

FIG. 1 shows the direct form for a FIR nonrecursive filter 10 in which $f_s = 1/T$ is the frequency at which input continuous-time function $V_{in}(t)$ is sampled. Filter 10 is denominated in the art as a tapped-delay-line filter or a transversal filter. The input signal to be filtered is presented at an input terminal 12 and sampled by a sampler 14, which is followed by M delay stages 16, each of which delays the associated sample by the sampling time interval T. At each node or tap 18, the signal is multiplied by a weighting coefficient h(K) in a multiplier 20, and the products are summed in a summer 22 to provide the filter output in discrete time:

$$V_{out}(nT) = \sum_{K=1}^{N} h(K) V_K(nT) \qquad [\text{Eqn. 1}]$$

As is well-known in the art, this output signal at the output terminal 24 represents the linear convolution of the sequences h(K) and the sampled input signal presented to output terminal 12. When h(K) is the sequence of coefficients defining the impulse response of the filter, which is determined as the inverse Fourier transform of the desired filter response in the frequency domain, output signal 24 is then the desired filter output in discrete time.

Figure 2:
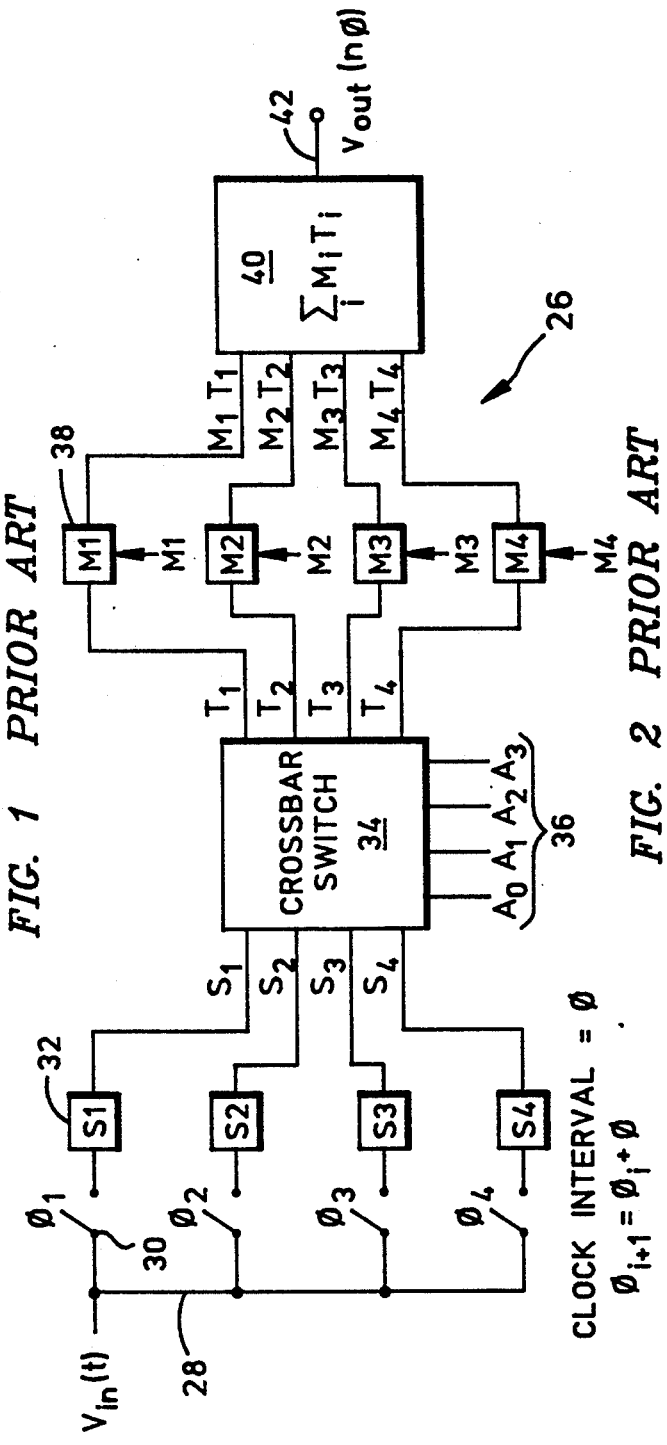
FIG. 2 shows a schematic representation of the analog capacitor-switching (CS) transversal filter from the prior art.

FIG. 2 shows a typical analog transversal filter 26 from the prior art. The input signal at input terminal 28 is sampled by closing a switch 30 momentarily and storing the resulting analog signal sample in a device 32. The several switches exemplified by switch 30 are closed in sequence one after the other by means of a series of clock signals $\theta_i$, which rotate sequentially in a manner well-known in the art. Thus, the signal samples $S_i$ represent a moving window embracing a continuous string of sequential samples of the input signal 28. These samples are presented to a crossbar switch 34 wherein they are continuously rotated across the crossbar switch outputs $T_i$ by means of the control signals $A_i$ at bus 36. The analog tap signals $T_i$ are distributed to a plurality of multipliers 38, which multiply each by a scaler coefficient $M_i$. The products are then added in the summer 40 to form a discrete time output signal at the output 42. Because filter 26 is an analog filter, each multiplier 38 and the summer 40 must operate on analog signal samples provided by the sample-and-hold devices exemplified by device 32.

Figure 3:
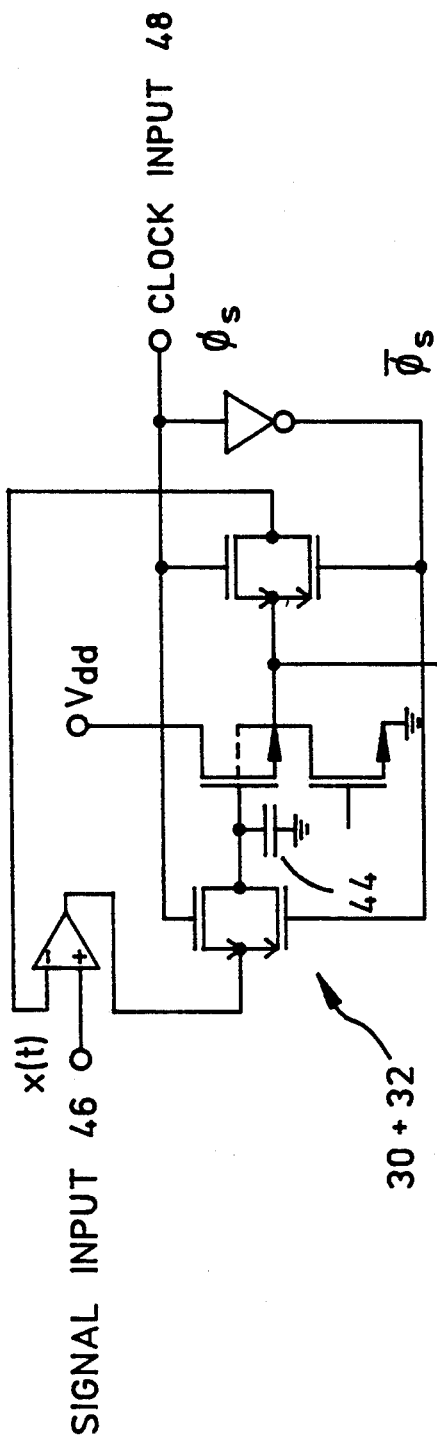
FIG. 3 shows a typical sample-and-hold (S/H) circuit implementation from the prior art suitable for implementing the sampling function for the filter of FIG. 2.

FIG. 3 shows a typical embodiment of sample-and-hold device 32 incorporating switch 30 from FIG. 2. This device charges a capacitor 44 to a voltage equal to that presented at input 46 whenever the clock input 48 is high. After clock input 48 falls low, the charge on capacitor 44 is retained and presented at the sample output 50 until clock input 48 once again goes high.

Figure 4:
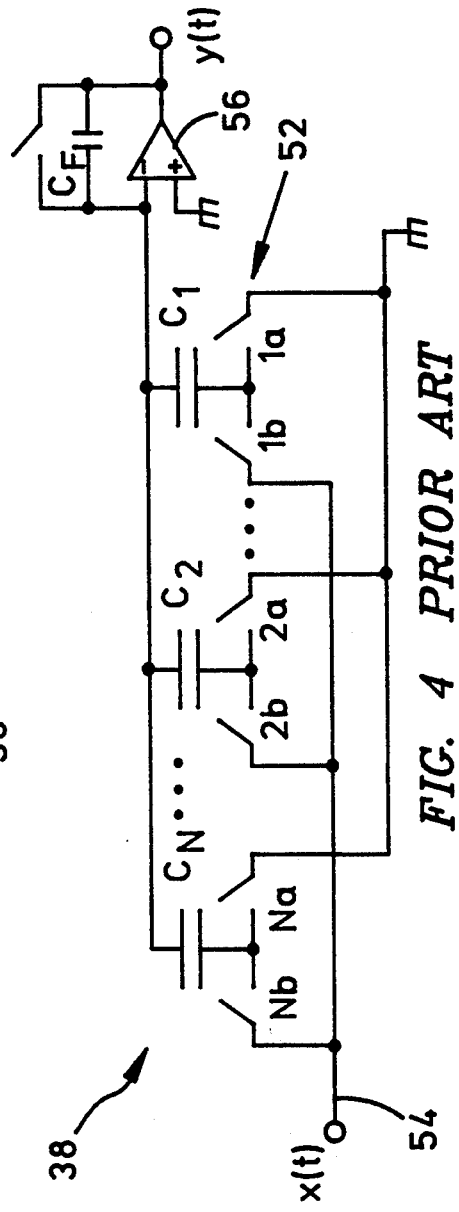
FIG. 4 shows a typical programmable capacitor element from the prior art suitable for implementing the multiplier function for the filter of FIG. 2.

FIG. 4 provides a typical embodiment of multiplier 38 from FIG. 2. The input signal x(t) is related to output signal y(t) by the ratio of the sum of the branch capacitors $C_i$ to the feedback capacitor $C_F$. The branch sum $\Sigma C_i$ can be selected under external program control through a plurality of switch pairs exemplified by switch pair 52. The tap signal sample x(t) must remain stable at input terminal 54 long enough to charge the capacitors and to permit the operational amplifier 56 to slew to and stabilize at the level of output signal y(t). This requirement imposes a speed limit on multiplier 38.

Figure 8A:
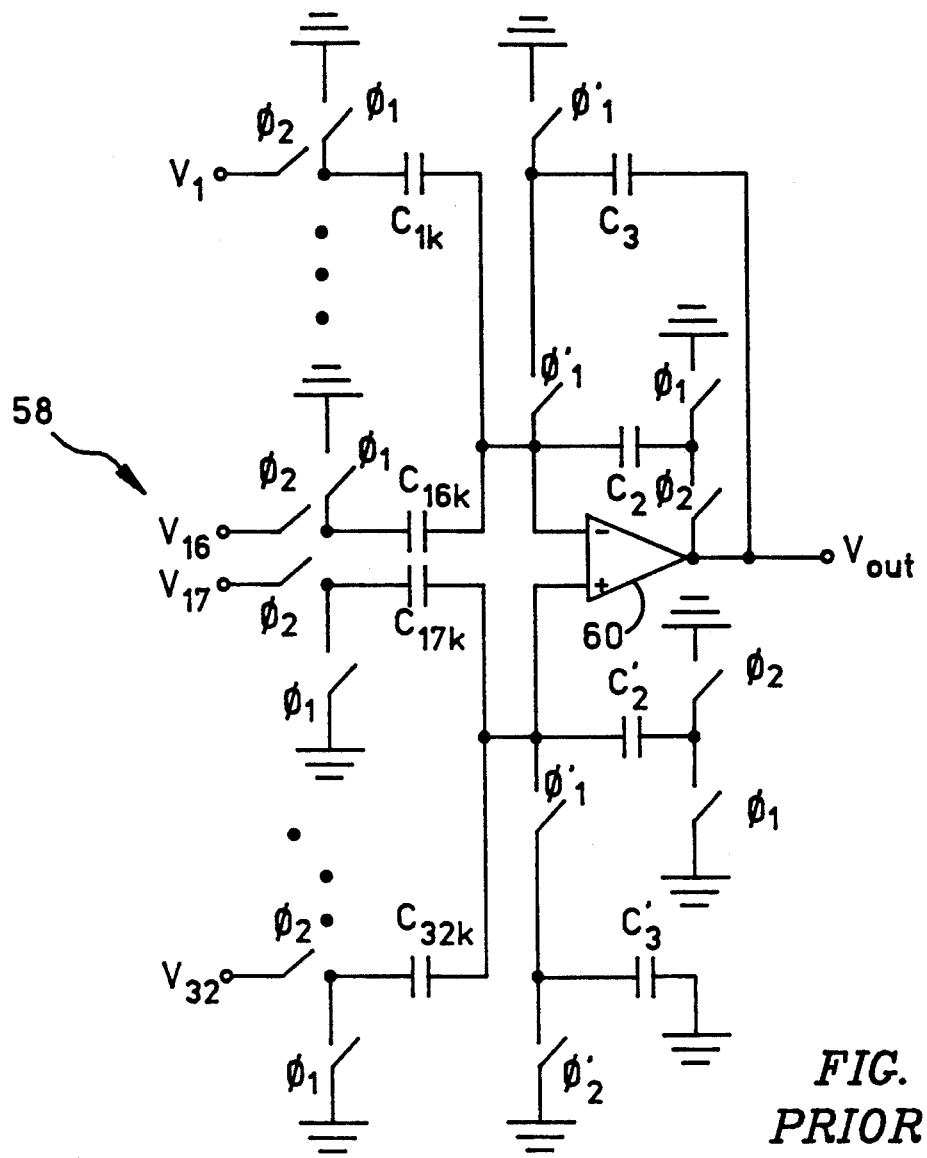
FIGS. 8A and 8B, shows a 32-bit summing amplifier embodiment from the prior art.
Figure 8B:
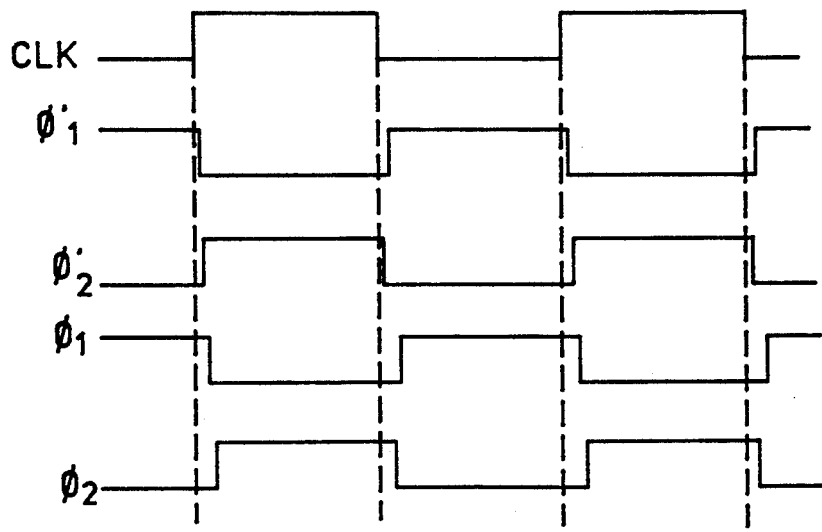

FIG. 8A shows a 32-input summing amplifier 58 that represents a typical embodiment of summer 40 in FIG. 2. FIG. 8B shows the five different clock waveforms necessary for proper operation of summing amplifier 58. The weighting and sign of each input is determined by the size of an input capacitor $C_{ik}$ and the input node of the operational amplifier 60 to which the signal is connected, respectively. Thus, amplifier 58 incorporates a multiplier in each tap arm. Each capacitor $C_{ik}$ can be embodied in the form shown in FIG. 4 so that the tap weight can be adjusted under external program control. If multiplier 38 (FIG. 4) is used in amplifier 58 (FIG. 8A) for each of the 32 capacitors $C_{ik}$, then summing amplifier 58 requires 33 individual operational amplifiers. If $C_{ik}$ uses only a single capacitance for each of the 32 tap weights, then summing amplifier 58 still requires operational amplifier 60, and the filter characteristic is nonprogrammable.

Thus, in the prior art, an analog transversal filter requires at least one and, if programmable, a significant plurality of operational amplifiers in the multiplier and summation functions discussed above in connection with FIGS. 1 and 2. Incorporation of operational amplifiers in CMOS substrates is inconvenient. Operational amplifier slew rate limitations slow the operating speed of monolithic analog transversal filters wherever they are used. But, opamps are less of a problem in the sample-and-hold circuit because their duty cycle is (1/N) of the slewing duty cycle of operational amplifier 60 (FIG. 8A).

The Invention

Figure 5:
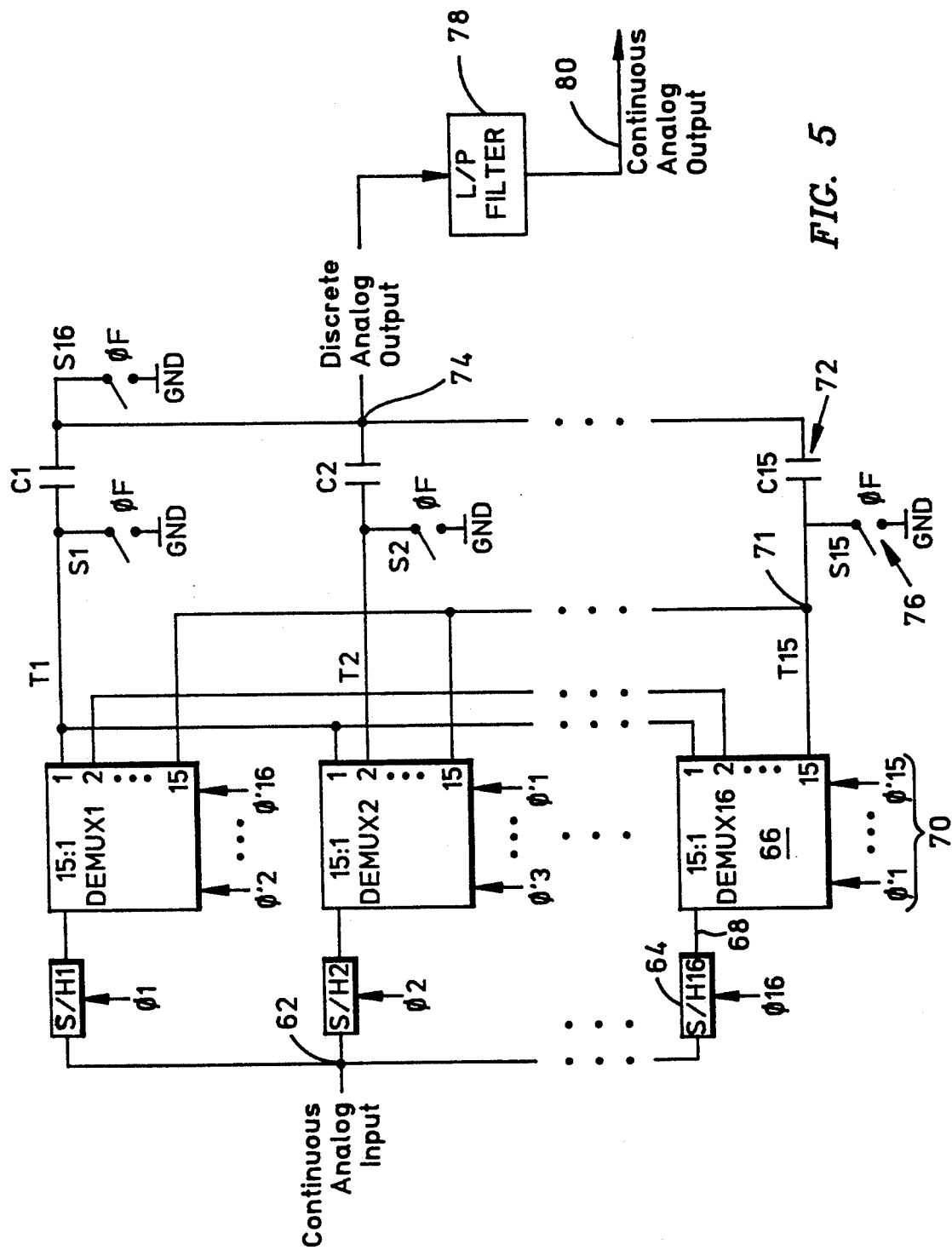
FIG. 5 shows a functional diagram of a preferred embodiment of the CS transversal filter of this invention, showing only the elements for one of the two identical differential signal paths.
Figure 6:
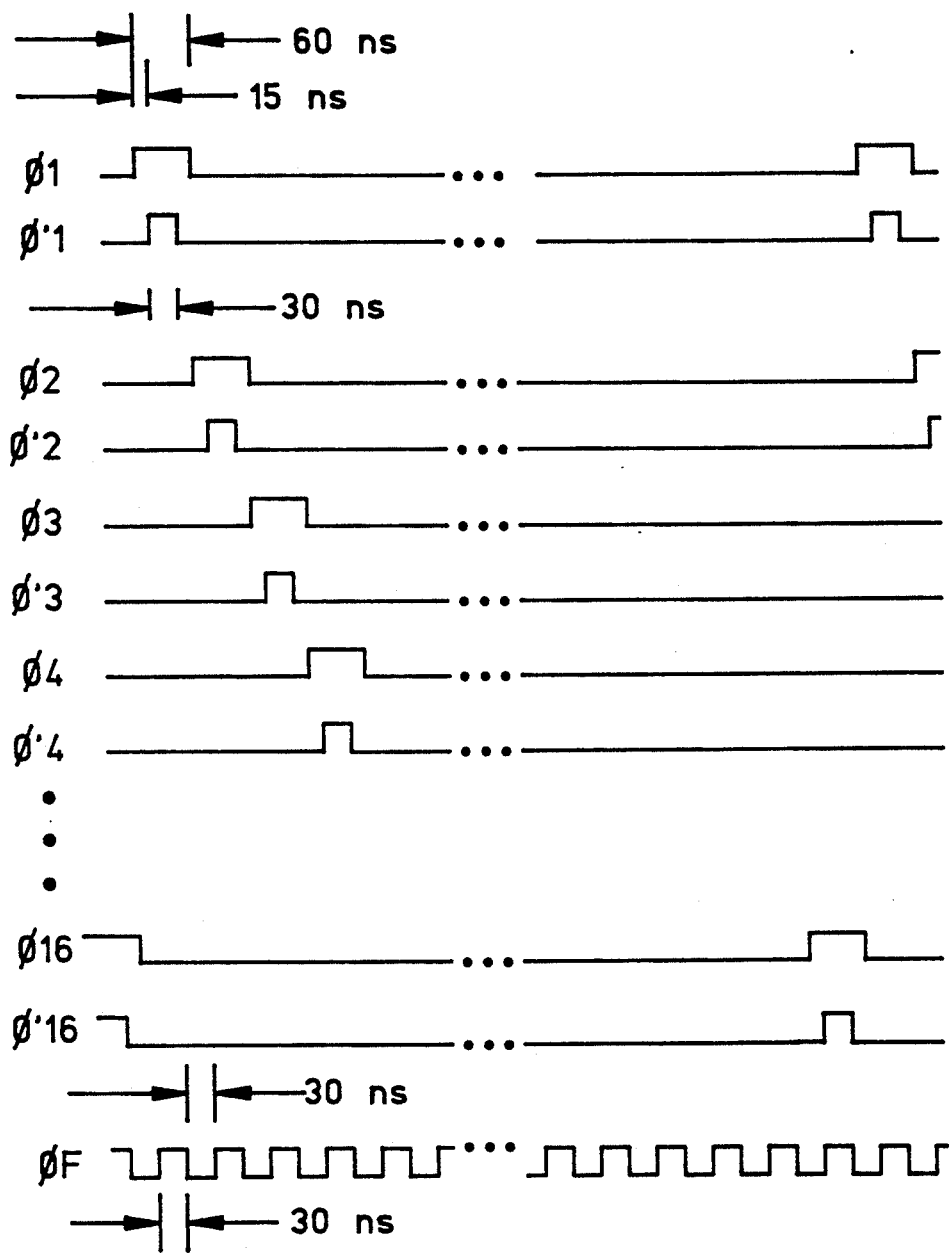
FIG. 6 shows the multi-phase clock signal timing diagram for the filter of FIG. 5.

FIG. 5 shows a functional block diagram of one side of the transversal filter of this invention. The circuit in FIG. 5 is repeated for the other differential input terminal (not shown), thereby providing differential input and differential output signals. The continuous analog input signal is presented at differential input terminal 62. Signal 62 is sampled by 16 sample-and-hold devices, exemplified by device 64. Sample-and-hold devices 64 are clocked by a 16-phase clock $\phi_i$, which is illustrated in FIG. 6. The primary clock $\phi_F$ is a symmetrical clock with a period of 60 ns. The sampling clocks $\phi_i$ are non-overlapping phase clocks with pulse widths of 60 ns. The multiplexer clocks $\phi'_i$, are 30 ns clocks produced by ANDing the appropriately delayed sampling clock $\phi_i$ and primary clock $\phi_F$.

Sample-and-hold device 64 is coupled to a demultiplexer 66. Demultiplexer 66 has one input 68 and 15 outputs $T_i$. Demultiplexer input 68 is connected to one of the 15 demultiplexer outputs $T_i$ under control of the demux clock bus 70. Each output $T_i$ from the 16 demuxes is connected commonly to a single tap line exemplified by the tap line 71 for $T_{15}$. Thus, to produce the tap delays required, demux 66 routes the sampled analog signal 68 to tap line 71 in accordance with the demux clock phases shown in Table 1 below.

TABLE 1

|  | $T_1$ | $T_2$ | $T_3$ | $T_4$ | $T_5$ | $T_6$ | $T_7$ | $T_8$ | $T_9$ | $T_{10}$ | $T_{11}$ | $T_{12}$ | $T_{13}$ | $T_{14}$ | $T_{15}$ | |
|---|---|---|---|---|---|---|---|---|---|---|---|---|---|---|---|---|
| S/H1 | $\phi'_2$ | $\phi'_3$ | $\phi'_4$ | $\phi'_5$ | $\phi'_6$ | $\phi'_7$ | $\phi'_8$ | $\phi'_9$ | $\phi'_{10}$ | $\phi'_{11}$ | $\phi'_{12}$ | $\phi'_{13}$ | $\phi'_{14}$ | $\phi'_{15}$ | $\phi'_{16}$ | Demux 1 |
| S/H2 | $\phi'_3$ | $\phi'_4$ | $\phi'_5$ | $\phi'_6$ | $\phi'_7$ | $\phi'_8$ | $\phi'_9$ | $\phi'_{10}$ | $\phi'_{11}$ | $\phi'_{12}$ | $\phi'_{13}$ | $\phi'_{14}$ | $\phi'_{15}$ | $\phi'_{16}$ | $\phi'_1$ | Demux 2 |
| S/H3 | $\phi'_4$ | $\phi'_5$ | $\phi'_6$ | $\phi'_7$ | $\phi'_8$ | $\phi'_9$ | $\phi'_{10}$ | $\phi'_{11}$ | $\phi'_{12}$ | $\phi'_{13}$ | $\phi'_{14}$ | $\phi'_{15}$ | $\phi'_{16}$ | $\phi'_1$ | $\phi'_2$ | Demux 3 |
| S/H4 | $\phi'_5$ | $\phi'_6$ | $\phi'_7$ | $\phi'_8$ | $\phi'_9$ | $\phi'_{10}$ | $\phi'_{11}$ | $\phi'_{12}$ | $\phi'_{13}$ | $\phi'_{14}$ | $\phi'_{15}$ | $\phi'_{16}$ | $\phi'_1$ | $\phi'_2$ | $\phi'_3$ | Demux 4 |
| S/H5 | $\phi'_6$ | $\phi'_7$ | $\phi'_8$ | $\phi'_9$ | $\phi'_{10}$ | $\phi'_{11}$ | $\phi'_{12}$ | $\phi'_{13}$ | $\phi'_{14}$ | $\phi'_{15}$ | $\phi'_{16}$ | $\phi'_1$ | $\phi'_2$ | $\phi'_3$ | $\phi'_4$ | Demux 5 |
| S/H6 | $\phi'_7$ | $\phi'_8$ | $\phi'_9$ | $\phi'_{10}$ | $\phi'_{11}$ | $\phi'_{12}$ | $\phi'_{13}$ | $\phi'_{14}$ | $\phi'_{15}$ | $\phi'_{16}$ | $\phi'_1$ | $\phi'_2$ | $\phi'_3$ | $\phi'_4$ | $\phi'_5$ | Demux 6 |
| S/H7 | $\phi'_8$ | $\phi'_9$ | $\phi'_{10}$ | $\phi'_{11}$ | $\phi'_{12}$ | $\phi'_{13}$ | $\phi'_{14}$ | $\phi'_{15}$ | $\phi'_{16}$ | $\phi'_1$ | $\phi'_2$ | $\phi'_3$ | $\phi'_4$ | $\phi'_5$ | $\phi'_6$ | Demux 7 |
| S/H8 | $\phi'_9$ | $\phi'_{10}$ | $\phi'_{11}$ | $\phi'_{12}$ | $\phi'_{13}$ | $\phi'_{14}$ | $\phi'_{15}$ | $\phi'_{16}$ | $\phi'_1$ | $\phi'_2$ | $\phi'_3$ | $\phi'_4$ | $\phi'_5$ | $\phi'_6$ | $\phi'_7$ | Demux 8 |
| S/H9 | $\phi'_{10}$ | $\phi'_{11}$ | $\phi'_{12}$ | $\phi'_{13}$ | $\phi'_{14}$ | $\phi'_{15}$ | $\phi'_{16}$ | $\phi'_1$ | $\phi'_2$ | $\phi'_3$ | $\phi'_4$ | $\phi'_5$ | $\phi'_6$ | $\phi'_7$ | $\phi'_8$ | Demux 9 |
| S/H10 | $\phi'_{11}$ | $\phi'_{12}$ | $\phi'_{13}$ | $\phi'_{14}$ | $\phi'_{15}$ | $\phi'_{16}$ | $\phi'_1$ | $\phi'_2$ | $\phi'_3$ | $\phi'_4$ | $\phi'_5$ | $\phi'_6$ | $\phi'_7$ | $\phi'_8$ | $\phi'_9$ | Demux 10 |
| S/H11 | $\phi'_{12}$ | $\phi'_{13}$ | $\phi'_{14}$ | $\phi'_{15}$ | $\phi'_{16}$ | $\phi'_1$ | $\phi'_2$ | $\phi'_3$ | $\phi'_4$ | $\phi'_5$ | $\phi'_6$ | $\phi'_7$ | $\phi'_8$ | $\phi'_9$ | $\phi'_{10}$ | Demux 11 |
| S/H12 | $\phi'_{13}$ | $\phi'_{14}$ | $\phi'_{15}$ | $\phi'_{16}$ | $\phi'_1$ | $\phi'_2$ | $\phi'_3$ | $\phi'_4$ | $\phi'_5$ | $\phi'_6$ | $\phi'_7$ | $\phi'_8$ | $\phi'_9$ | $\phi'_{10}$ | $\phi'_{11}$ | Demux 12 |
| S/H13 | $\phi'_{14}$ | $\phi'_{15}$ | $\phi'_{16}$ | $\phi'_1$ | $\phi'_2$ | $\phi'_3$ | $\phi'_4$ | $\phi'_5$ | $\phi'_6$ | $\phi'_7$ | $\phi'_8$ | $\phi'_9$ | $\phi'_{10}$ | $\phi'_{11}$ | $\phi'_{12}$ | Demux 13 |
| S/H14 | $\phi'_{15}$ | $\phi'_{16}$ | $\phi'_1$ | $\phi'_2$ | $\phi'_3$ | $\phi'_4$ | $\phi'_5$ | $\phi'_6$ | $\phi'_7$ | $\phi'_8$ | $\phi'_9$ | $\phi'_{10}$ | $\phi'_{11}$ | $\phi'_{12}$ | $\phi'_{13}$ | Demux 14 |
| S/H15 | $\phi'_{16}$ | $\phi'_1$ | $\phi'_2$ | $\phi'_3$ | $\phi'_4$ | $\phi'_5$ | $\phi'_6$ | $\phi'_7$ | $\phi'_8$ | $\phi'_9$ | $\phi'_{10}$ | $\phi'_{11}$ | $\phi'_{12}$ | $\phi'_{13}$ | $\phi'_{14}$ | Demux 15 |
| S/H16 | $\phi'_1$ | $\phi'_2$ | $\phi'_3$ | $\phi'_4$ | $\phi'_5$ | $\phi'_6$ | $\phi'_7$ | $\phi'_8$ | $\phi'_9$ | $\phi'_{10}$ | $\phi'_{11}$ | $\phi'_{12}$ | $\phi'_{13}$ | $\phi'_{14}$ | $\phi'_{15}$ | Demux 16 |

Referring to Table 1, the output from sample-and-hold device S/H1 is connected to tap T1 when clock $\phi'_2$ is high. As soon as $\phi'_2$ falls, the signal is disconnected. When $\phi'_3$ rises, the output from S/H1 is connected to tap $T_2$. Demux 1 proceeds along the row, sequentially connecting and disconnecting S/H1 to $T_i$ until $\phi'_{16}$ falls. At that point, demux 1 remains disconnected until $\phi'_2$ once again rises. This process can be understood by analogy for all other such input signals and demuxes with reference to Table 1.

Each of the tap signals, exemplified by tap signal 71 ($T_{15}$) is connected to a multiplying and summing network consisting of 15 capacitor circuits $C_i$, exemplified by capacitor circuit 72 ($C_{15}$). The output sides of all capacitor circuits $C_i$ are connected together to form the discrete analog output signal at output terminal 74. A key element of this invention is the absence of operational amplifiers in the multiplying and summing region of the filter shown in FIG. 5.

Referring momentarily to FIG. 6, note that primary clock $\phi_F$ cycles continuously, closing the plurality of switches $S_i$ exemplified by switch 76 ($S_{15}$). Each time switch 76 is closed, all charge is removed from capacitor circuit 72. During the half-cycle that $\phi_F$ is high, the tap signals $T_i$ are connected to capacitor networks $C_i$, the capacitor networks $C_i$ charge up and the resulting voltages are summed at output terminal 74. The discrete analog output signal at terminal 74 can be expressed as:

$$V_{out} = \frac{\sum_{i=1}^{15} T_i C_i}{\sum_{i=1}^{15} C_i} \quad \text{[Eqn. 2]}$$

Note that this summing arrangement is "self-normalizing". That is, the resulting output voltage is scaled by the sum of weighting capacitors $C_i$. This is a very useful result and is not available from the opamp-based circuits known in the art.

For instance, referring to FIG. 8, note that the output voltage of summing amplifier 58 is related to the input voltages $V_i$ and the multiplying capacitors $C_{ik}$ according to the following relationship:

$$V_{out} = -\sum_{i=1}^{16} V_i \frac{C_{ik}}{C_2} + \sum_{i=17}^{32} V_i \frac{C_{ik}}{C'_2} \quad \text{[Eqn. 3]}$$

This is not equivalent to the exact sum of voltages $V_i$ because of the operational amplifier feedback capacitors $C_2$ and $C'_2$. If the values of $C_{ik}$ are fixed, then the operational amplifier feedback capacitors $C_2$ and $C_2'$ can be selected to normalize the resulting output voltage $V_{out}$. External programmability is a highly desirable feature of an analog transversal filter and the necessary variation in $C_{ik}$ under program control shifts the normalization of the filter output. This normalization shift is difficult to accurately compensate.

Figure 7A:
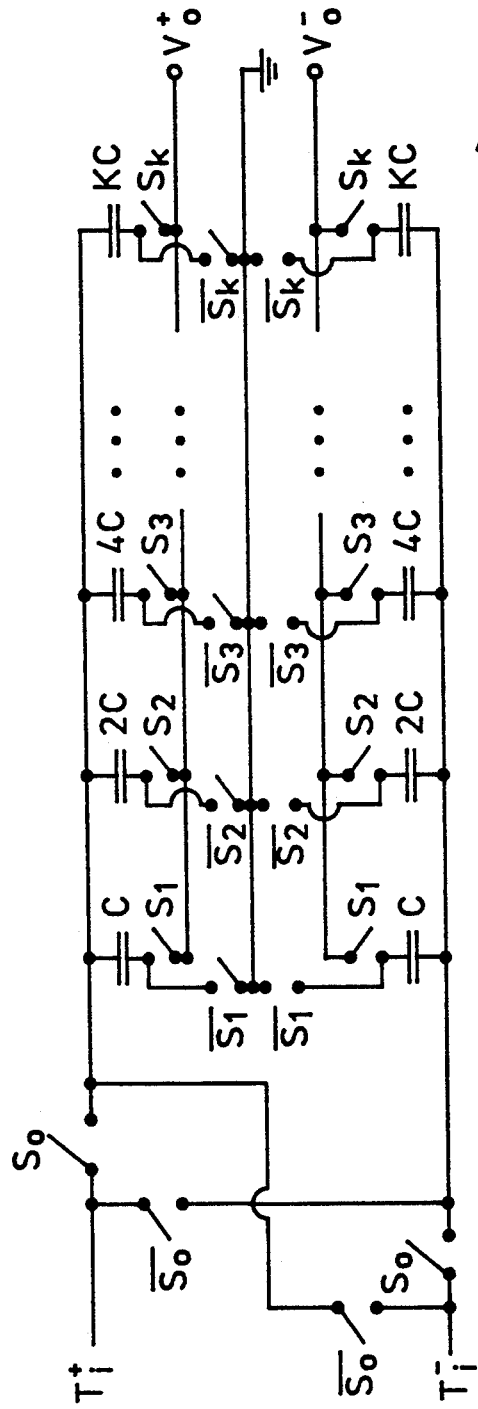
FIGS. 7A and 7B, shows a preferred embodiment of a programmable capacitor element from the filter of FIG. 5.
Figure 7B:
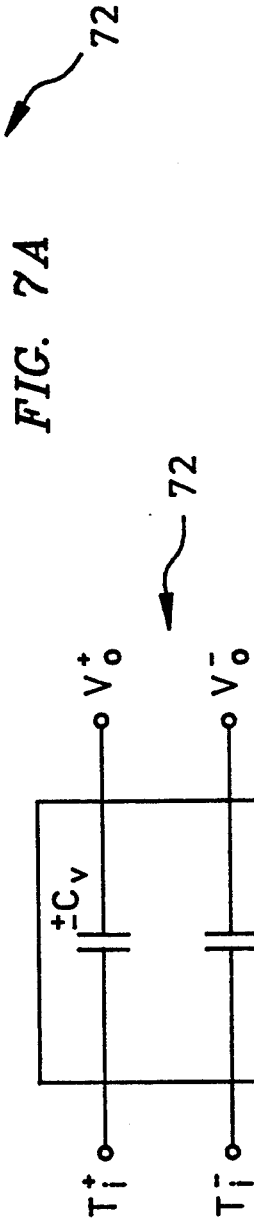

FIG. 7A shows a preferred embodiment of capacitor network circuit 72 from FIG. 6. Both differential input terminals $T_i+$ and $T_i-$ are shown in FIGS. 7A and 7B to permit demonstration of the polarity-switching scheme preferred for this invention. Capacitor network 72 includes a net capacitance value $C_v$ in series between the $T_i+$ input differential terminal and the $V_0+$ output differential terminal and an identical net capacitance value $C_v$ between the two other corresponding differential terminals ($T_i-$ and $V_0-$) The value of $C_v$ is selected under external program control by means of a signed binary control word consisting of a sign bit $S_0$ and k magnitude bits ($S_k \ldots S_2 S_1$), as shown in FIG. 7B.

In the preferred embodiment, $C_v = S.C$ in microfarads, where C is the value of the smallest capacitor in a geometric binary series of capacitors, C, 2C, 4C ..., KC, where $K = 2^{k-1}$. The binary control word S is presented to capacitor network 72 on a control word bus 82. The sign bit $S_0$ operates to open switches $S_0$ and close switches $\bar{S}_0$ in FIG. 7A. The circuit in FIG. 7A demonstrates that $S_0 = 0$ connects $T_i+$ to $V_0-$ and $S_0 = 1$ connects $T_i+$ to $V_0-$. Thus, $S_0$ operates to reverse the effective sign of the multiplier capacitor value $C_v$ presented by capacitor network 72.

The remaining bits in the signed binary control word S operate similarly on the switches $S_i$ and $\bar{S}_i$ in FIG. 7A. For instance, $S_1 = 1$ connects the capacitor C so that it is included in the capacitor value $C_v$. Similarly, $S_i$ connects the $i^{th}$ capacitor element having a value equal to $2^{i-1}.C$. It is this arrangement of individual capacitor element values that permits the simple relationship $C_v = S.C$ in microfarads.

Although not necessary, a low-pass filter 78 may be added to the output terminal 74 to recover a continuous analog output signal at terminal 80. The waveform at output terminal 74 in FIG. 5 is a series of pulses, the magnitudes of which represent the desired signal amplitude of the filter output. LP filter 78 may be added to reconstruct a continuous analog output signal at terminal 80. One method for doing this is to sample the signal at output 74 and pass the samples through a multiple order low-pass filter. A preferred filter for this application is a sixth-order Butterworth filter that can be readily constructed on the monolithic integrated circuit chip used to realize all other components of the transversal filter of this invention. A series of cascaded Sallen-Key low-pass second-order sections arranged to produce a Butterworth response is preferred. Other types of low-pass filters are also suitable for this application.

The preferred realization of the transversal filter of this invention is in a BiCMOS monolithic integrated circuit. The sample-and-hold elements should be implemented in bipolar form for enhanced speed and the remaining elements should be implemented in CMOS for reduced power consumption.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawing.

We claim:

1. A transversal filter having an input terminal for receiving an input signal and an output terminal, said transversal filter comprising:

a plurality N of sample-and-hold means each having a sample output, wherein N is a positive integer greater than unity;

a plurality N of first switch means coupled to said sample-and-hold means for connecting a selected one of said sample-and-hold means to said input terminal, whereby said selected one of said sample-and-hold means receives said input signal;

a plurality N of capacitor means each having a capacitance value connected between an input side and an output side, wherein all said output sides are connected to said output terminal;

a plurality N of demultipexer means coupled between said plurality N of sample outputs and said plurality N of capacitor means for connecting each said sample output to the input side of a selected one of said capacitor means;

a plurality N of second switch means coupled to said plurality N of capacitor means for connecting the input and output sides of said plurality N of capacitor means together;

sequence control means coupled to said plurality N of first switch means for selecting in sequence each of said first switch means, whereby said input terminal is momentarily connected to each said sampleand-hold means in sequence such that said plurality N of sample-and-hold means holds N sequential samples of said input signal; and clock means coupled to said sequence control means and said plurality N of second switch means for synchronizing the operation of said first and second switch means, whereby a discrete time analog output signal is produced at said output terminal.

2. The transversal filter of claim 1 wherein said capacitance values are variable, said transversal filter further comprising:

filter control means coupled to said plurality N of capacitor means for adjusting said capacitance values.

3. The transversal filter of claim 2 wherein said each capacitor means comprises:

a plurality K of fixed capacitors each having a first plate connected to said input side of said each capacitor means and a second plate, wherein K is a positive integer greater than unity; and a plurality K of third switch means coupled to said filter control means, each said third switch means being for connecting said second plate of one of said fixed capacitors to said output side of said each capacitor means.

4. The transversal filter of claim 3 wherein said each capacitor means further comprises:

a differential pair of input terminals at said input side;

a differential pair of output terminals as said output side; and inverter means for reversing the polarity of said differential output terminals with respect to said differential input terminals.

5. The transversal filter of claim 4 wherein said plurality K of fixed capacitors includes a geometric binary progression of capacitance values such that each said fixed capacitor in said progression is valued at half of the capacitance value of a higher said fixed capacitor in said progression.

6. The transversal filter of claim 5 wherein all elements of said transversal filter are embodied in a single monolithic integrated circuit.

7. The transversal filter of claim 6 wherein said monolithic integrated circuit includes both bipolar and Complementary Metal-Oxide Semiconductor (CMOS) devices.

8. The transversal filter of claim 1 further comprising:

low-pass filter means coupled to said output terminal for reconstructing a continuous time analog output signal from said discrete time analog signal.

9. The transversal filter of claim 8 wherein said capacitance values are variable, said transversal filter further comprising:

filter control means coupled to said plurality N of capacitor means for adjusting said capacitance values.

10. The transversal filter of claim 9 wherein said each capacitor means comprises:

a plurality K of fixed capacitors each having a first plate connected to said input side of said each capacitor means and a second plate, wherein K is a positive integer greater than unity; and a plurality K of third switch means coupled to said filter control means, each said third switch means being for connecting said second plate of one of said fixed capacitors to said output side of said each capacitor means.

11. The transversal filter of claim 10 wherein said each capacitor means further comprises:

a differential pair of input terminals at said input side;

a differential pair of output terminals as said output side; and inverter means for reversing the polarity of said differential output terminals with respect to said differential input terminals.

12. The transversal filter of claim 1 wherein all elements of said transversal filter are embodied in a single monolithic integrated circuit.

13. The transversal filter of claim 12 wherein said monolithic integrated circuit includes both bipolar and Complementary Metal-Oxide Semiconductor (CMOS) devices.

* * * * *